United States Patent
Kanazawa

(10) Patent No.: US 8,836,330 B2
(45) Date of Patent: Sep. 16, 2014

(54) MAGNETIC RESONANCE IMAGING APPARATUS AND MAGNETIC RESONANCE IMAGING METHOD

(75) Inventor: Hitoshi Kanazawa, Utsunomiya (JP)

(73) Assignees: Kabushiki Kaisha Toshiba, Tokyo (JP); Toshiba Medical Systems Corporation, Otawara-Shi (JP)

( * ) Notice: Subject to any disclaimer, the term of this patent is extended or adjusted under 35 U.S.C. 154(b) by 574 days.

(21) Appl. No.: 12/966,151

(22) Filed: Dec. 13, 2010

(65) Prior Publication Data

US 2011/0148412 A1   Jun. 23, 2011

(30) Foreign Application Priority Data

Dec. 17, 2009 (JP) ................................. 2009-286590
Oct. 19, 2010 (JP) ................................. 2010-234905

(51) Int. Cl.
*G01V 3/00* (2006.01)
*G01R 33/28* (2006.01)

(52) U.S. Cl.
CPC .................................. *G01R 33/288* (2013.01)
USPC ..................................................... 324/309

(58) Field of Classification Search
USPC ................................................. 324/300–322
See application file for complete search history.

(56) References Cited

U.S. PATENT DOCUMENTS 6,426,623 B1    7/2002 Bernstein
6,812,698 B1 *  11/2004 Tsukamoto .................. 324/309
2004/0017195 A1 * 1/2004 Kassai et al. ................. 324/315
2006/0047198 A1   3/2006 Sugimoto
2008/0081987 A1 * 4/2008 Miyazaki ...................... 600/410
2009/0289631 A1 * 11/2009 Van Den Brink et al. .... 324/309
2011/0105888 A1 * 5/2011 Arai .............................. 600/410

FOREIGN PATENT DOCUMENTS

| JP | 07-323016 A | 12/1995 | |
|---|---|---|---|
| JP | 2003-319919 A | 11/2003 | |
| JP | 2006-095278 A | 4/2006 | |
| JP | 2006-280820 A | 10/2006 | |
| JP | 2009-034341 A | 2/2009 | |
| JP | 5259715 B2 | 1/2010 | |
| WO | 2010/001747 A1 | 1/2010 | |
| WO | WO 2010001747 A1 * | 1/2010 | ............. A61B 5/055 |

OTHER PUBLICATIONS

Japanese Office Action with its English translation for Japanese Patent Application No. 2010-234905 mailed on Mar. 11, 2014.

* cited by examiner

*Primary Examiner* — Melissa Koval
*Assistant Examiner* — Daniel Miller
(74) *Attorney, Agent, or Firm* — Yoshida & Associates, LLC

(57) ABSTRACT

According to one embodiment, an MRI apparatus includes a calculation unit and an imaging unit. The calculation unit calculates "a value of a parameter having an upper limit" for "a plurality of patterns of scan orders for a plurality of scan operations for an object" respectively. The imaging unit generates image data for each of the scan operations by performing the plurality of scan operations based on a result of the calculation.

16 Claims, 15 Drawing Sheets

| SCAN | SCAN INTENSITY [W/kg] | SCAN TIME [SECOND] |
|---|---|---|
| A | 8 | 120 |
| B | 4 | 360 |
| C | 2 | 360 |

FIG. 2

| PATTERN | FIRST | SECOND | THIRD |
|---|---|---|---|
| (1) | A | B | C |
| (2) | A | C | B |
| (3) | B | A | C |
| (4) | B | C | A |
| (5) | C | A | B |
| (6) | C | B | A |

FIG. 3

| TIME [SECOND] | (1) ABC | (2) ACB | (3) BAC | (4) BCA | (5) CAB | (6) CBA |
|---|---|---|---|---|---|---|
| 0 | 8 | 8 | 4 | 4 | 2 | 2 |
| 60 | 8 | 8 | 4 | 4 | 2 | 2 |
| 120 | 4 | 2 | 4 | 4 | 2 | 2 |
| 180 | 4 | 2 | 4 | 4 | 2 | 2 |
| 240 | 4 | 2 | 4 | 4 | 2 | 2 |
| 300 | 4 | 2 | 4 | 4 | 2 | 2 |
| 360 | 4 | 2 | 8 | 2 | 8 | 4 |
| 420 | 4 | 2 | 8 | 2 | 8 | 4 |
| 480 | 2 | 4 | 2 | 2 | 4 | 4 |
| 540 | 2 | 4 | 2 | 2 | 4 | 4 |
| 600 | 2 | 4 | 2 | 2 | 4 | 4 |
| 660 | 2 | 4 | 2 | 2 | 4 | 4 |
| 720 | 2 | 4 | 2 | 8 | 4 | 8 |
| 780 | 2 | 4 | 2 | 8 | 4 | 8 |
| 840 | 0 | 0 | 0 | 0 | 0 | 0 |
| 900 | 0 | 0 | 0 | 0 | 0 | 0 |
| 960 | 0 | 0 | 0 | 0 | 0 | 0 |
| 1020 | 0 | 0 | 0 | 0 | 0 | 0 |
| 1080 | 0 | 0 | 0 | 0 | 0 | 0 |
| 1140 | 0 | 0 | 0 | 0 | 0 | 0 |
| 1200 | 0 | 0 | 0 | 0 | 0 | 0 |

FIG. 4

| SCAN | SCAN INTENSITY [W/kg] | SCAN TIME [SECOND] |
|---|---|---|
| A' | 5 | 120 |
| B' | 3 | 360 |
| C | 2 | 360 |

FIG. 12

| TIME [SECOND] | (1)'  A' B' C | (2)'  A' C B' |
|---|---|---|
| 0 | 5 | 5 |
| 60 | 5 | 5 |
| 120 | 3 | 2 |
| 180 | 3 | 2 |
| 240 | 3 | 2 |
| 300 | 3 | 2 |
| 360 | 3 | 2 |
| 420 | 3 | 2 |
| 480 | 2 | 3 |
| 540 | 2 | 3 |
| 600 | 2 | 3 |
| 660 | 2 | 3 |
| 720 | 2 | 3 |
| 780 | 2 | 3 |
| 840 | 0 | 0 |

FIG. 13

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2009-286590, filed on Dec. 17, 2009 and Japanese Patent Application No. 2010-234905 filed on Oct. 19, 2010.

The entire contents of which are incorporated herein by reference.

BACKGROUND

1. Field

Embodiments described herein relate generally to an MRI (magnetic resonance imaging) apparatus and an MRI method.

Additionally, embodiments described herein relate to MRI technology to reduce "a value of a parameter having an upper limit" such as SAR (Specific Absorption Rate).

2. Description of the Related Art

MRI is an imaging method which magnetically excites nuclear spin of an object (a patient) set in a static magnetic field with an RF pulse having the Larmor frequency and reconstructs an image based on nuclear magnetic resonance signals (hereinafter referred to as MR signals) generated due to the excitation.

In MRI, an RF coil is used to transmit an RF pulse to cause nuclear magnetic resonance to a region to be imaged. The resonance frequency of the RF pulse is proportional to the intensity of the static magnetic field generated by the MRI apparatus. For example, in the case of a static magnetic field of 1.5 tesla, the resonance frequency is 63.8 MHz.

The RF pulse at this frequency causes an increase in temperature of the body of the object. Therefore, from the viewpoint of safety, the International Electrotechnical Commission (IEC) standard or other standards prescribe the upper limit of the energy of the RF pulse applied to the object.

Specifically, supposing that the energy of the RF pulse absorbed by 1 kg of living tissue is expressed in terms of SAR, it is prescribed that the SAR value for an arbitrarily set period of 10 seconds and the SAR value for an arbitrarily set period of 6 minutes do not exceed a first upper limit and a second upper limit, respectively. The upper limit of the SAR value varies depending on the region to be imaged, such as the whole body and the head.

In order to satisfy the safety standard concerning SAR, according to a conventional technique disclosed in U.S. Pat. No. 6,426,623, a sum of the energy values of the RF pulses transmitted to the object is calculated for each of the preceding 1 second, the preceding 5 seconds and the preceding 10 seconds.

And change of the pulse sequence is performed, if any of the following three cases occurs. A first case is that the sum for the preceding 1 second exceeds a first predetermined value. A second case is that the sum for the preceding 5 seconds exceeds a second predetermined value. A third case is that the sum for the preceding 10 seconds exceeds a third predetermined value. In the technique disclosed in U.S. Pat. No. 6,426,623, stopping of an RF pulse generator is given as an example of the aforementioned change of the pulse sequence. However, this may lead to cessation of imaging.

Thus, according to a conventional technique disclosed in Japanese Patent Laid-Open No. 2006-95278, the SAR value for the head or other regions to be imaged (referred to as a regional SAR hereinafter) is calculated before imaging. If the calculated regional SAR exceeds the upper limit, a warning message is displayed, and then, the pulse sequence is modified to prevent the regional SAR from exceeding the upper limit, and imaging is performed after it is verified that the dose to the object does not exceed the upper limit of the regional SAR.

The conventional technique disclosed in Japanese Patent Laid-Open No. 2006-95278 has preferred effects and advantages as described above. However, the modification of the pulse sequence that results in a reduction of the number of slices or the like is preferably as little as possible. This is because, for MRI diagnosis, imaging is preferably performed under optimal conditions that the number of slices is maximized as far as the SAR value does not exceed the upper limit, for example.

Therefore, there is a demand for a technique of reducing SAR so that imaging can be performed under optimal conditions.

In addition, there is a demand for a technique of reducing the value of a parameter other than SAR that has an upper limit.

BRIEF DESCRIPTION OF THE DRAWINGS

In the accompanying drawings:

FIG. 2 is a table showing an SAR intensity and a scan duration for each of scans A, B and C in the first embodiment;

FIG. 3 is a table showing patterns of the scan order of the scans A, B and C in the first embodiment;

FIG. 4 a table showing the SAR intensity at every 60 seconds for the six order patterns (1) to (6) for comparison;

FIG. 12 is a table showing an SAR intensity and a scan duration for each of the scans A', B' and C in the second embodiment;

FIG. 13 is a table showing the SAR intensity at every 60 seconds for scan order patterns (1)' and (2)' according to the second embodiment for comparison;

DETAILED DESCRIPTION

One embodiment of the present invention aim to provide MRI technology to reduce "a value of a parameter having an upper limit" such as SAR, but the present invention is not limited to this aim.

In the following description, the terms "scan" and "scan operation" mean an operation of "transmitting an RF pulse to cause nuclear magnetic resonance to an object" and "receiving an MR signal caused by the RF pulse from the object". That is, the "scan" and the "scan operation" refer to a so-called data acquisition processing and do not include the meaning of an image reconstructing processing.

According to one embodiment, a magnetic resonance imaging apparatus includes a calculation unit and an imaging unit. The calculation unit calculates "a value of a parameter having an upper limit" for "a plurality of patterns of scan orders for a plurality of scan operations for an object" respectively. The imaging unit generates image data for each of the scan operations by performing the plurality of scan operations based on a result of the calculation.

According to another embodiment, the calculation unit calculates SAR as the value of a parameter having an upper limit.

According to another embodiment, a magnetic resonance imaging method includes the steps of:

(a) performing calculation of "a value of a parameter having an upper limit" for "a plurality of patterns of scan orders for a plurality of scan operations for the object" respectively; and (b) generating image data for each of the scan operations by performing the plurality of scan operations based on a result of the calculation.

A magnetic resonance imaging apparatus and a magnetic resonance imaging method according to embodiments of the present invention will be described with reference to the accompanying drawings.

Note that the same reference numbers are given for identical components in each figure, and overlapping explanation is abbreviated.

First Embodiment

Figure 1:
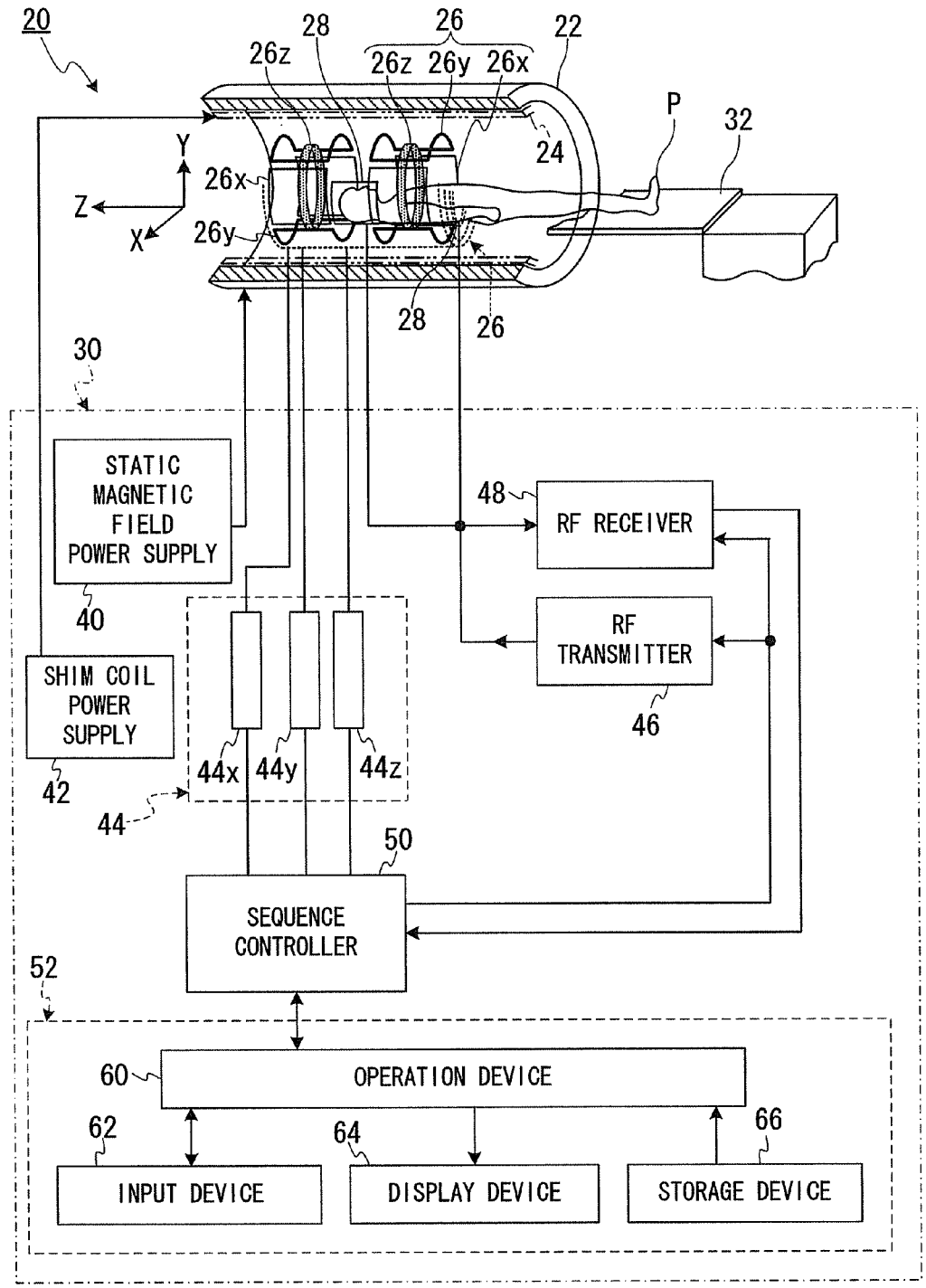
FIG. 1 is a block diagram showing a magnetic resonance imaging apparatus according to the first embodiment of the present invention.

FIG. 1 is a block diagram showing general structure of a magnetic resonance imaging apparatus 20 according to an embodiment of the present invention.

A magnetic resonance imaging apparatus 20 includes a cylinder-shaped static magnetic field magnet 22 for generating a static magnetic field, a cylinder-shaped shim coil 24 arranged inside the static magnetic field magnet 22, a gradient coil 26 (i.e. gradient magnetic field coil 26), RF coils 28, a control system 30, and a bed 32 for placing an object (e.g. a patient) P on it.

As one example, the following description will be made on the assumption that an X axis, a Y axis and a Z axis are perpendicular to each other. In addition, it is assumed that the bed 32 is disposed in such a position that the direction of "the normal line of the table plane thereof on which an object is put" is the same as the Y axis direction. Moreover, the direction of an axis of the static magnetic field magnet 22 and the shim coil 24 is aligned with the direction of the Z axis.

The control system 30 includes a static magnetic field power supply 40, a shim coil power supply 42, a gradient magnetic field power supply 44, an RF transmitter 46, an RF output measuring unit 48, an RF receiver 48, a sequence controller 50 and a computer 52.

The gradient magnetic field power supply 44 includes an X-axis gradient magnetic field power supply 44$x$, a Y-axis gradient magnetic field power supply 44$y$ and a Z-axis gradient magnetic field power supply 44$z$.

The computer 52 includes an operation device 60, an input device 62, a display device 64 and a storage device 66.

The static magnetic field magnet 22 is electrically connected to the static magnetic field power supply 40 and has a function to generate a static magnetic field in an imaging space by using electric current supplied from the static magnetic field power supply 40.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26$x$, a Y-axis gradient coil 26$y$ and a Z-axis gradient coil 26$z$. Each of the X-axis gradient coil 26$x$, the Y-axis gradient coil 26$y$ and the Z-axis gradient coil 26$z$ is cylinder-shaped and arranged inside the static magnetic field magnet 22.

The X-axis gradient coil 26$x$, the Y-axis gradient coil 26$y$ and the Z-axis gradient coil 26$z$ are electrically connected to the X-axis gradient magnetic field power supply 44$x$, the Y-axis gradient magnetic field power supply 44$y$ and the Z-axis gradient magnetic field power supply 44$z$ of the gradient magnetic field power supply 44 respectively.

The X-axis gradient magnetic field power supply 44$x$, the Y-axis gradient magnetic field power supply 44$y$ and the Z-axis gradient magnetic field power supply 44$z$ supply electric current to the X-axis gradient coil 26$x$, the Y-axis gradient coil 26$y$ and the Z-axis gradient coil 26$z$ respectively so as to generate a gradient magnetic field Gx in the X-axis direction, a gradient magnetic field Gy in the Y-axis direction and a gradient magnetic field Gz in the Z-axis direction in the imaging space.

The RF transmitter 46 generates RF pulses in accordance with control information provided from the sequence controller 50, and outputs the generated RF pulses to the transmission RF coil 28.

The RF coils 28 include "a WBC (whole body coil) built in the gantry for transmission and reception of RF pulses" and "local coils arranged around the bed 32 or the object P for reception of RF pulses".

The transmission RF coil 28 transmits an RF pulse given from the RF transmitter 46 to the object P. The reception RF coil 28 receives an MR signal generated due to excited nuclear spin inside the object P by the RF pulse and this MR signal is detected by the RF receiver 48.

The RF receiver 48 generates raw data which are digitized complex number data obtained by performing predetermined signal processing and A/D (analogue to digital) conversion to the detected MR signal, and inputs the generated raw data to the sequence controller 50.

The sequence controller 50 storages control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 50 generates the gradient magnetic fields Gx, Gy and Gz in the X-axis, Y-axis and Z-axis directions and RF pulses by driving the gradient magnetic field power supply 44, the RF transmitter 46 and the RF receiver 48 according to a predetermined sequence stored. Additionally, the sequence controller 50 receives raw data of an MR signal inputted from the RF receiver 48, and input the raw data to the operation device 60.

The operation device 60 performs system control of the magnetic resonance imaging apparatus 20 in imaging operation. Additionally, in a case where a plurality of scans of a same object P are consecutively performed, the operation device 60 automatically sets an optimal scan order. This is a significant characteristic of a first embodiment and will be described below.

In the first embodiment, for purposes of illustration, there will be described a method of setting a scan order in a case where three scans, a scan A, a scan B and a scan C, are performed under different imaging conditions in a temporally consecutive manner (without intermission).

In the following description, it is assumed that SAR referred to means SAR for the whole body, and it is prescribed by a safety criterion that a 10-second average SAR value and a 6-minute average SAR value do not exceed 12 [W/kg] and 4 [W/kg], respectively (the same holds true for the second embodiment described later).

FIG. 2 is a table showing an SAR intensity and a scan duration for each of the scans A, B and C. The SAR intensity [W/kg] and the scan duration are calculated by the operation device 60 under an imaging condition for each of the scans A, B and C inputted by an operator.

FIG. 3 is a table showing patterns (1) to (6) of the scan order of the scans A, B and C shown in FIG. 2. In this example, since three scans are performed, the number of scan patterns is 6, the factorial of 3.

FIG. 4 is a table showing the SAR intensity at different points in time for the six order patterns (1) to (6) for comparison. In the following description, it is assumed that, for any scan order, t=0 when imaging of the first scan starts, and FIG. 4 shows the SAR intensity for every 60 seconds of elapsed time t. Regardless of the scan order, the three scans A, B and C are completed in 840 seconds (14 minutes). Therefore, once the elapsed time t reaches 840 seconds, the SAR intensity is zero [W/kg] regardless of the scan pattern.

In addition, the operation device 60 calculates time variations of the 10-second average SAR value and the 6-minute average SAR value for all the scan patterns (1) to (6).

Figure 5:
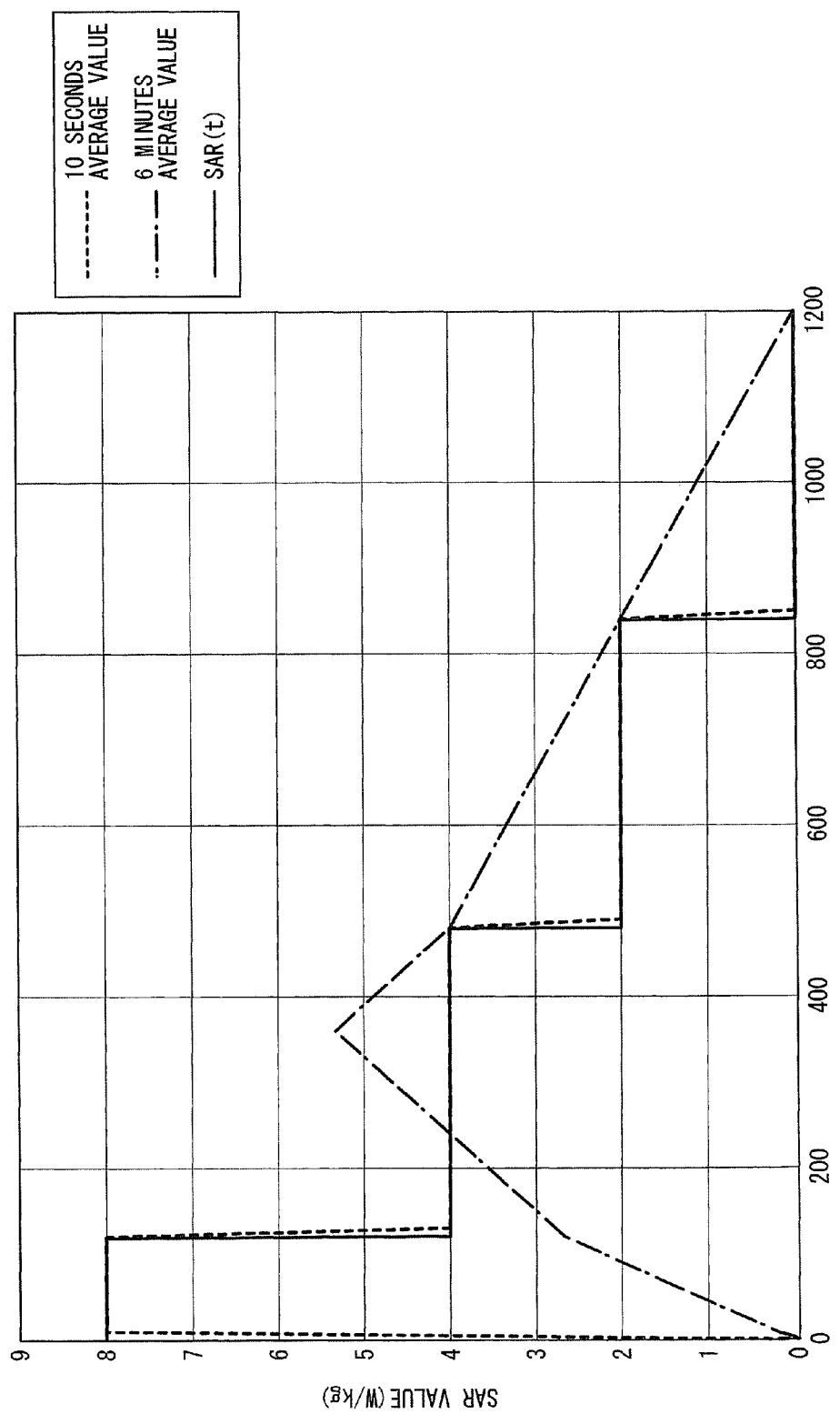
FIG. 5 is a graph showing time variations of the SAR intensity, the 10-second average SAR value, and the 6-minute average SAR value for the scan pattern (1) in which the scan A is first, the scan B is next, and the scan C is final.

FIG. 5 is a graph showing time variations of the SAR intensity, the 10-second average SAR value, and the 6-minute average SAR value for the scan pattern (1) in which the scan A is first performed, then the scan B is performed, and finally the scan C is performed. In FIG. 5, the solid line indicates the SAR intensity [W/kg] at each elapsed time t (in seconds), the dashed line indicates a time variation of the 10-second average SAR value, and the alternate long and short dash line indicates a time variation of the 6-minute average SAR value.

The operation device 60 performs a calculation involved with this graph. For example, the 10-second average SAR value at an elapsed time t1 is calculated by dividing "the time integral of the SAR intensity [W/kg] over 10 seconds just before the elapsed time t1" by 10. The operation device 60 calculates the 6-minute average SAR value in FIG. 5 in the same way.

For the pattern (1) shown in FIG. 5, the 10-second average SAR value does not exceed 12 [W/kg], which is a safety criterion value (a safety reference value). However, the 6-minute average SAR value exceeds 4 [W/kg], which is a safety criterion value, in a period from the elapsed time of 240 seconds to the elapsed time of 480 seconds.

FIGS. 6 to 10 are graphs showing time variations of the SAR intensity, the 10-second average SAR value, and the 6-minute average SAR value for the scan patterns (2) to (6) in the same way as FIG. 5.

Figure 6:
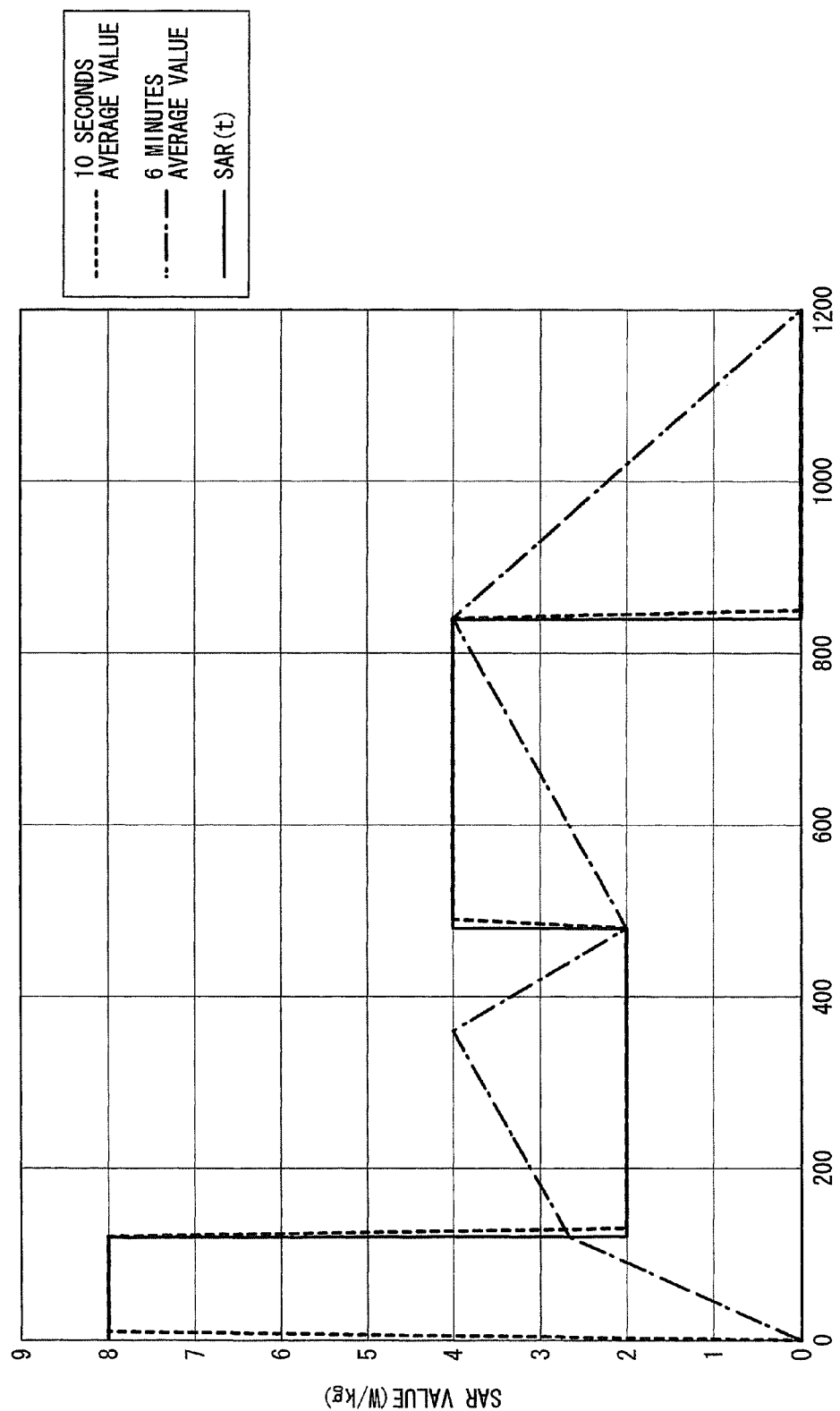
FIG. 6 is a graph showing time variations of the SAR intensity, the 10-second average SAR value, and the 6-minute average SAR value for the scan pattern (2) in which the scan A is first, the scan C is next, and the scan B is final.

FIG. 6 shows the scan pattern (2) in which the scan A is first performed, then the scan C is performed, and finally the scan B is performed.

Figure 7:
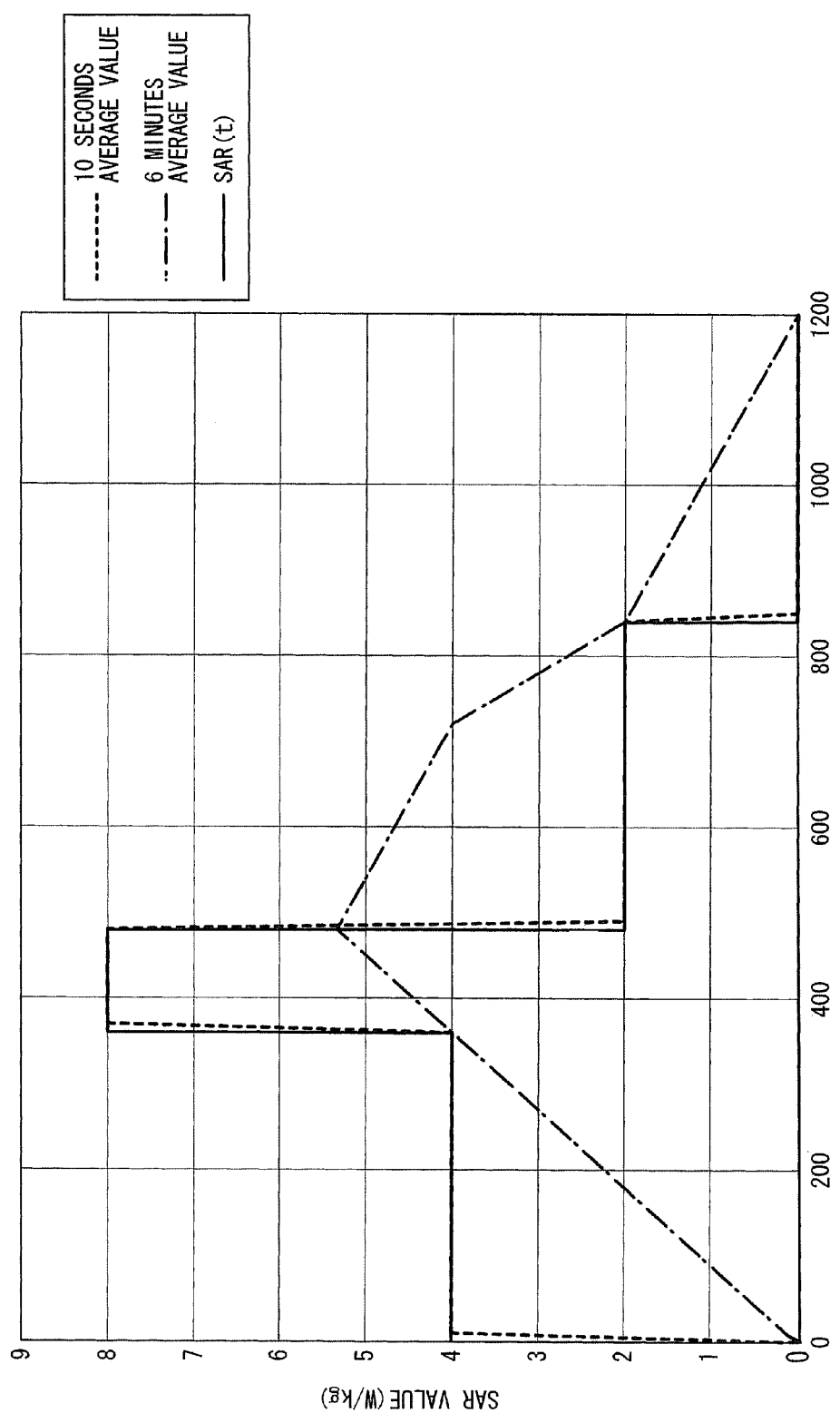
FIG. 7 is a graph showing time variations of the SAR intensity, the 10-second average SAR value, and the 6-minute average SAR value for the scan pattern (3) in which the scan B is first, the scan A is next, and the scan C is final.

FIG. 7 shows the scan pattern (3) in which the scan B is first performed, then the scan A is performed, and finally the scan C is performed.

Figure 8:
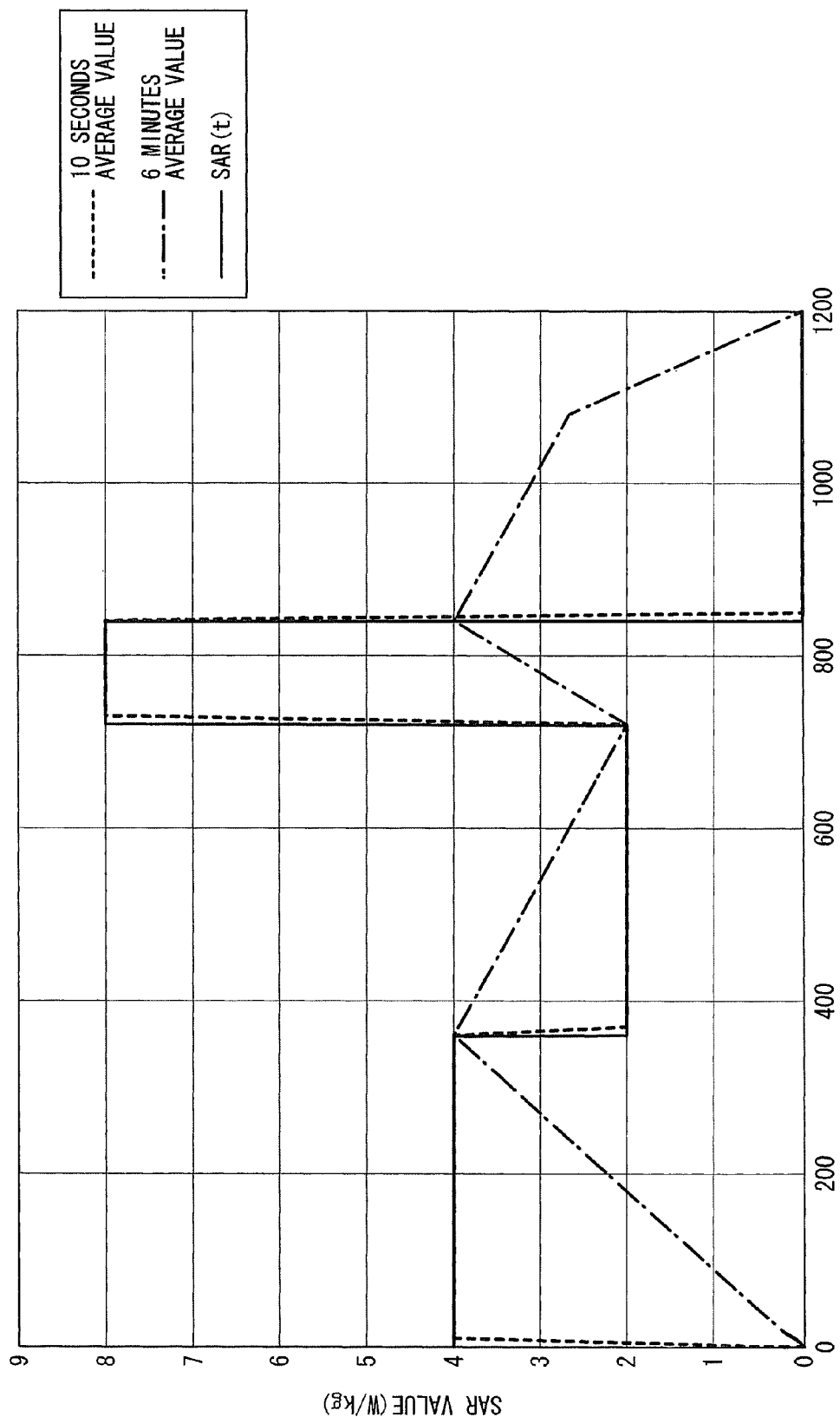
FIG. 8 is a graph showing time variations of the SAR intensity, the 10-second average SAR value, and the 6-minute average SAR value for the scan pattern (4) in which the scan B is first, the scan C is next, and the scan A is final.

FIG. 8 shows the scan pattern (4) in which the scan B is first performed, then the scan C is performed, and finally the scan A is performed.

Figure 9:
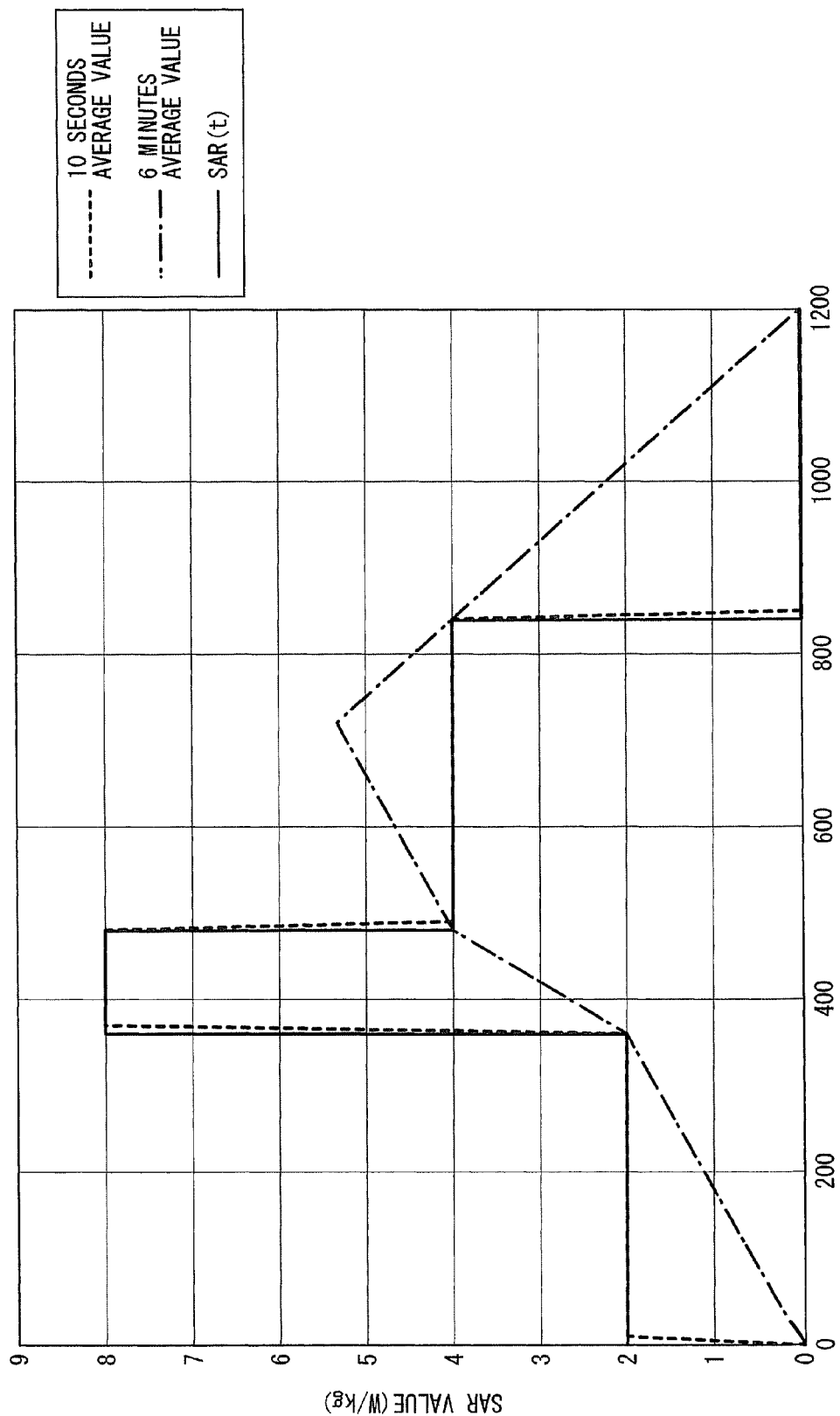
FIG. 9 is a graph showing time variations of the SAR intensity, the 10-second average SAR value, and the 6-minute average SAR value for the scan pattern (5) in which the scan C is first, the scan A is next, and the scan B is final.

FIG. 9 shows the scan pattern (5) in which the scan C is first performed, then the scan A is performed, and finally the scan B is performed.

Figure 10:
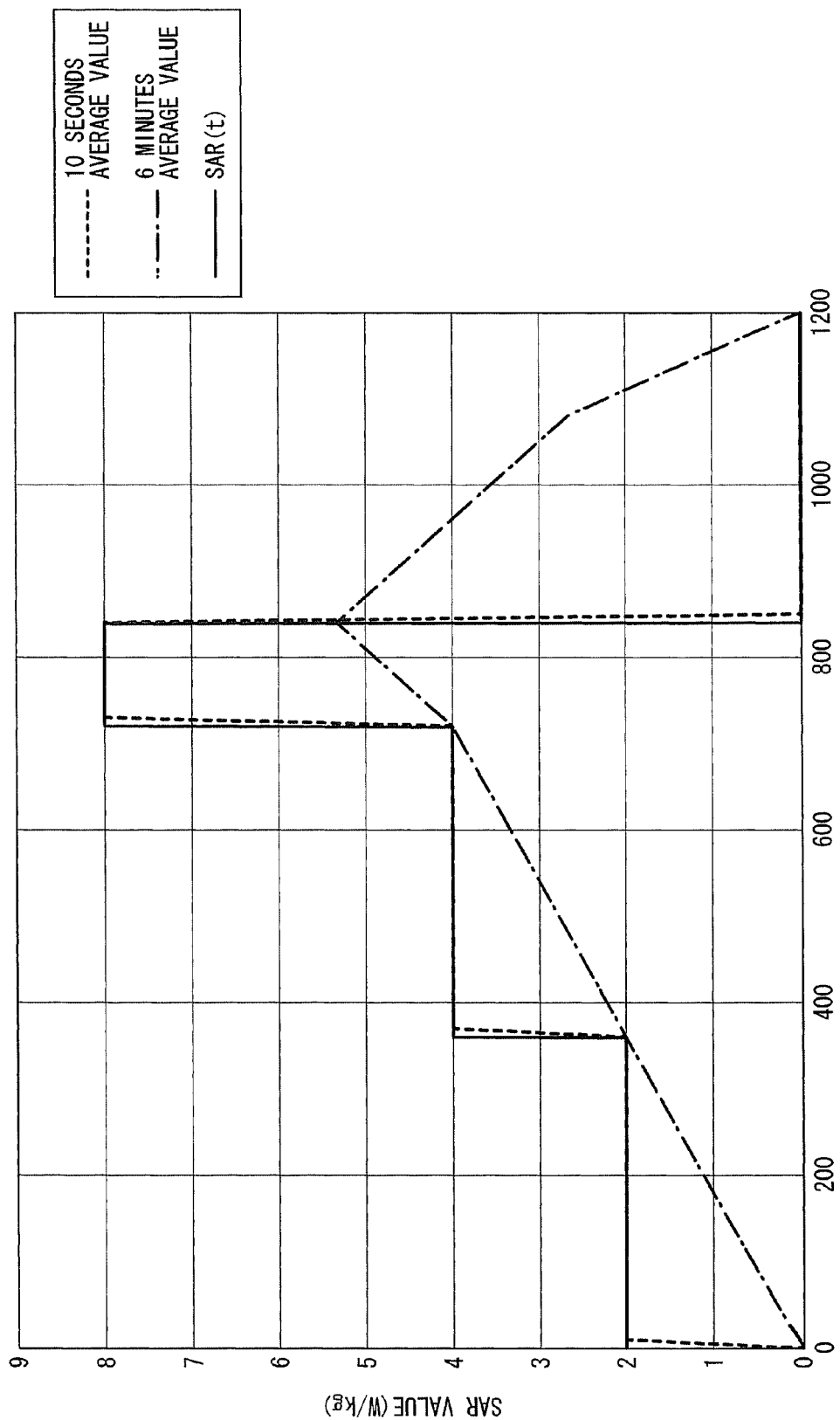
FIG. 10 is a graph showing time variations of the SAR intensity, the 10-second average SAR value, and the 6-minute average SAR value for the scan pattern (6) in which the scan C is first, the scan B is next, and the scan A is final.

FIG. 10 shows the scan pattern (6) in which the scan C is first performed, then the scan B is performed, and finally the scan A is performed.

Figure 11:
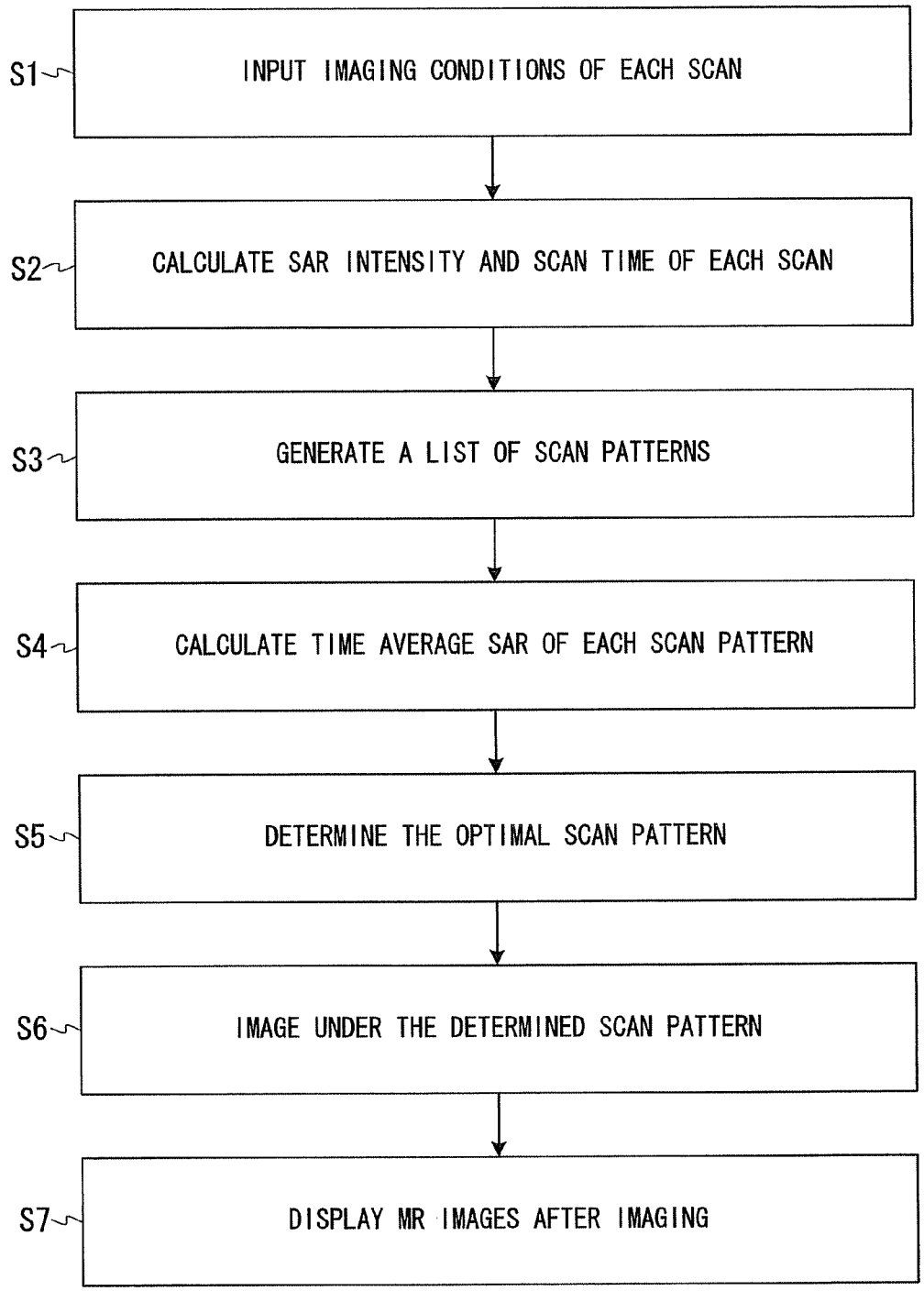
FIG. 11 is a flowchart for illustrating a flow of a process performed by an MRI apparatus 20 according to the first embodiment.

FIG. 11 is a flowchart for illustrating a flow of a process performed by an MRI apparatus 20 according to the first embodiment. In the following, according to the step numbers in the flowchart shown in FIG. 11, an operation of the MRI apparatus 20 according to the first embodiment will be described by referring to FIGS. 2 to 10 as required.

[Step S1] The operator inputs imaging conditions for the scans A, B and C consecutively performed on the same object P via the input device 62. The operator also can set, via the input device 62, the order in which the MR images resulting from the scans are displayed after imaging.

[Step S2] The operation device 60 calculates the SAR intensity [W/kg] and the scan duration for the scans A, B and C based on the inputted imaging conditions for the scans A, B and C (see FIG. 2).

[Step S3] The operation device 60 creates a list of scan order patterns based on the fact that the maximum number of scan order patterns is the factorial of n, supposing that the number of scans is denoted by "n". In the example in the first embodiment, 6 scan order patterns (1) to (6) are created as shown in FIG. 3.

Note that the order of Steps S2 and S3 can be reversed.

[Step S4] The operation device 60 calculates time variations of the 10-second average SAR value and the 6-minute average SAR value for each of the patterns (1) to (6) (see FIGS. 5 to 10).

[Step S5] Based on the result of calculation in Step S4, the operation device 60 compares the maximum values of the 10-second average SAR value among the patterns (1) to (6). Similarly, the operation device 60 compares the maximum values of the 6-minute average SAR value among the patterns (1) to (6). The operation device 60 selects a pattern for which the maximum value of the 10-second average SAR value or the maximum value of the 6-minute average SAR value is the smallest, as an optimal scan order pattern.

If "the pattern for which the maximum value of the 10-second average. SAR value is the smallest" and "the pattern for which the maximum value of the 6-minute average SAR value is the smallest" differ, the latter pattern is preferably selected. This is because it is considered that the longer the time is taken to calculate the average value, the greater the degree of reduction of SAR is provided by changing the scan order (that is, the greater the advantage of optimization of the scan order becomes). If at least one of the maximum value of the 10-second average SAR value and the maximum value of the 6-minute average SAR value exceeds the safety criterion value for all the patterns, the operation device 60 displays an indication thereof on the display device 64 and returns the process to Step S1 to prompt the operator to set imaging conditions again.

In the example in the first embodiment, the maximum value of the 10-second average SAR value is 8 [W/kg] and satisfies the safety criterion for all the patterns (1) to (6) (see FIGS. 5 to 10). On the other hand, the maximum value of the 6-minute average SAR value exceeds 4 [W/kg], which is the safety criterion value, for the pattern (1) shown in FIG. 5, the pattern (3) shown in FIG. 7, the pattern (5) shown in FIG. 9 and the pattern (6) shown in FIG. 10. Therefore, these four patterns are excluded from the selection of an optimal scan order pattern described above.

Comparing the pattern (2) shown in FIG. 6 and the pattern (4) shown in FIG. 8 that satisfy the safety criterion, the maximum value of the 6-minute average SAR value is 4 [W/kg] for the both patterns. Therefore, the operation device 60 can select any of the patterns (2) and (4) as an optimal scan order pattern. As an example, it is assumed herein that the operation device 60 prefers "an initially set scan order pattern" or "a scan order pattern that is closer to the order corresponding to the display order of MR images specified in Step S1 by the operator".

[Step S6] According to the scan order pattern ((2) or (4)) selected in Step S5, imaging is performed. More specifically, a prepulse, an RF pulse for acquiring image data or the like is transmitted, and then, an MR signal from the object P is detected by the RF receiver 48. The sequence controller 50 inputs raw data of the MR signal to the operation device 60, and the operation device 60 performs a predetermined processing on the raw data to generate image data and stores the image data in the storage device 66.

[Step S7] The operation device 60 displays the generated image data on the display device 64 in the form of an MR image. At this time, if the order of display of MR images after imaging is set in Step S1, the operation device 60 sequentially displays the MR images in the previously set display order.

The foregoing is a description of an operation of the MRI apparatus 20 according to the first embodiment. In the following, differences from prior art will be described.

If the scan order is fixed to the order set by the operator as in prior art, the maximum value of the time average SAR has to be compared with the safety criterion value before starting imaging in each scan, for example. In this case, depending on the scan order set by the operator, the time average SAR may exceed the safety criterion value. In such a situation, the start of the scan has to be delayed until the time average SAR is equal to or lower than the safety criterion value or the flip angle has to be reduced to satisfy the safety criterion. In this case, a decrease in imaging efficiency, a degradation in image quality or other trade-offs inevitably occurs.

In this regard, the inventor has noted the following point. That is, in a case where a plurality of scans are consecutively performed, the maximum value of the time average SAR (the 10-second average SAR value and the 6-minute average SAR value in the example described above) varies due to the effect of the SAR intensity in a temporally adjacent scan, even if the scans are performed under the same imaging conditions.

In particular, in the following two cases, the maximum value of the 6-minute average SAR value is averaged over a period including periods in which the scan intensity is zero before the start and after the end of all the scans, and therefore tends not to be significantly large. A first case is a case where the SAR intensity is the highest in the first scan and is low in the second scan (the case of the pattern (2)). The second case is a case where the SAR intensity is the highest in the last scan and is low in the second last scan (the case of the pattern (4)).

In other words, when a plurality of scans that involve relatively high SAR intensities are temporally concentrated (consecutive), the maximum value of the time average SAR tends to be large.

Thus, in the first embodiment, the maximum value of the time average SAR is calculated for all the possible scan orders, and the scan order is appropriately changed so that the maximum value of the time average SAR is minimized.

Thus, the maximum value of the 6-minute average SAR value of 5.33 [W/kg] for the pattern (1) can be reduced by about 25% to 4 [W/kg] simply changing the scan order pattern to the pattern (2) or (4), thereby satisfying the safety criterion. In other words, SAR can be reduced without changing the imaging conditions for each scan or providing a waiting time between the scans. Therefore, restrictions, such as a delay of the start time of a scan and a change of the imaging conditions for each scan that involves a degradation in image quality, can be minimized.

Since the operator can specify a desired order of display of MR images after imaging in Step S1, a change of the scan order causes no significant operational confusion.

Second Embodiment

The configuration of an MRI apparatus according to a second embodiment is the same as the configuration of the MRI apparatus 20 according to the first embodiment shown in FIG. 1. Therefore, the diagram showing the configuration of the apparatus is omitted, and the MRI apparatus according to the second embodiment is denoted by the same reference numeral 20 as in the first embodiment. The second embodiment is primarily characterized in that a scan condition optimization mode is provided in addition to a fixed scan condition mode, which provides the same operation as in the first embodiment. In the scan condition optimization mode, when there is a predetermined margin between the maximum value of the time average SAR and the safety criterion value, the imaging conditions for each scan are modified so as to bring the maximum value of the time average SAR closer to the safety criterion value.

In the second embodiment, for purposes of illustration, there will be described a method of setting a scan order in a case where three scans, a scan A', a scan B' and a scan C, are performed under different imaging conditions in a temporally consecutive manner (without intermission).

FIG. 12 is a table showing a SAR intensity and a scan duration for each of the scans A', B' and C. Although the scan C is performed under the same imaging conditions as in the first embodiment, the scans A' and B' are performed with SAR intensities lower than those for the scans A and B in the first embodiment.

In addition, in the second embodiment, as an example, it is assumed that the scan A' is the first scan for any scan order. Therefore, there are only two possible scan patterns (1)' in which the scan A' is first performed, then the scan B' is performed, and finally the scan C is performed, and (2)' in which the scan A' is first performed, and then the scan C is performed, and finally the scan B' is performed.

FIG. 13 is a table showing the SAR intensity at every 60 seconds for all the scan order patterns (1)' and (2)' according to the second embodiment for comparison. In the following description, it is assumed that, for any scan order, t=0 when imaging of the first scan starts. Since the scans are completed in 840 seconds (14 minutes) regardless of the scan order, once the elapsed time t reaches 840 seconds, the SAR intensity is zero [W/kg] regardless of the scan pattern.

Figure 14:
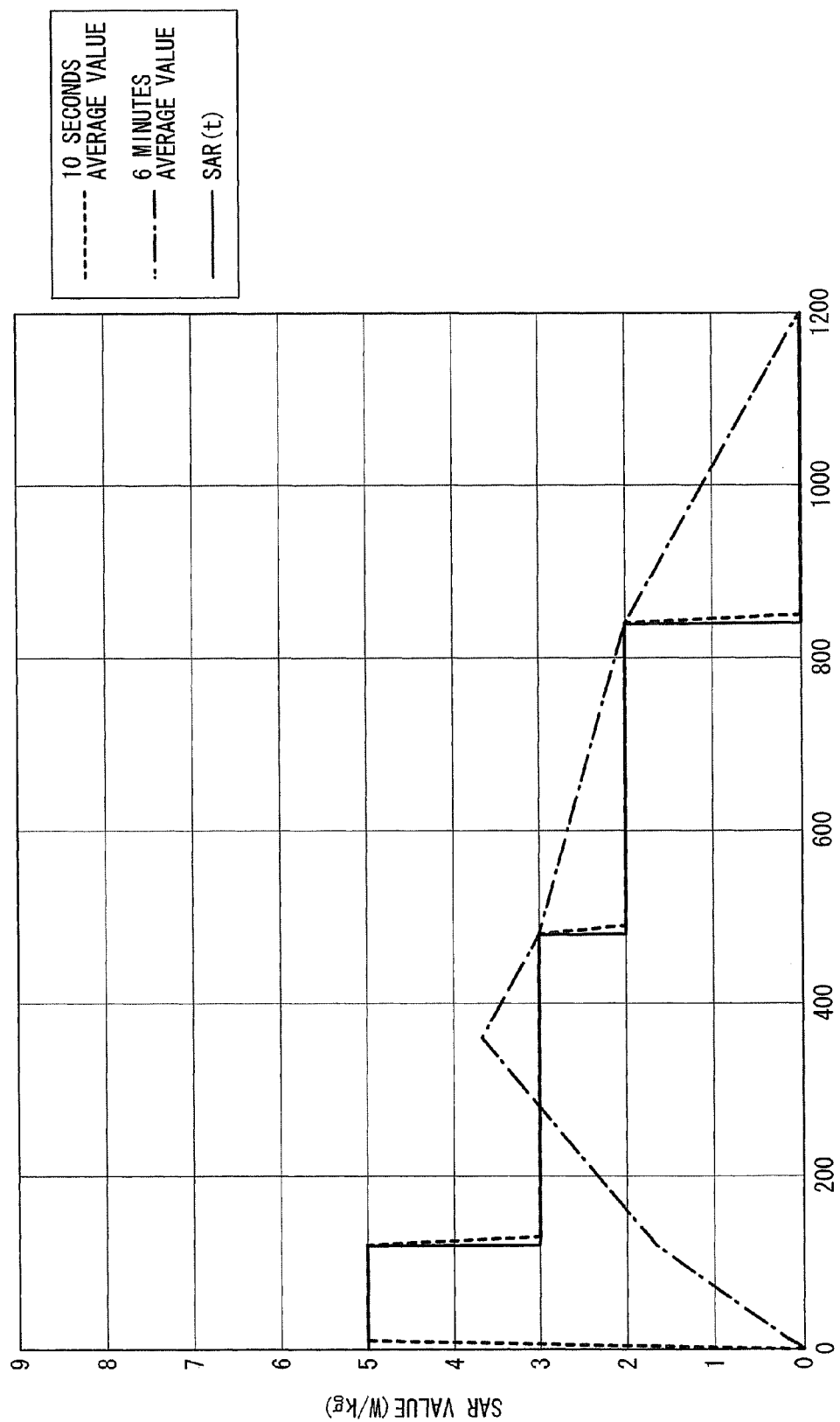
FIG. 14 is a graph showing time variations of the SAR intensity, the 10-second average SAR value, and the 6-minute average SAR value for the scan pattern (1)' in which the scan A' is first, the scan B' is next, and the scan C is final.

FIG. 14 is a graph similar to the graph of FIG. 5 showing time variations of the SAR intensity, the 10-second average SAR value, and the 6-minute average SAR value for the scan pattern (1)' in which the scan A' is first performed, then the scan B' is performed, and finally the scan C is performed.

Figure 15:
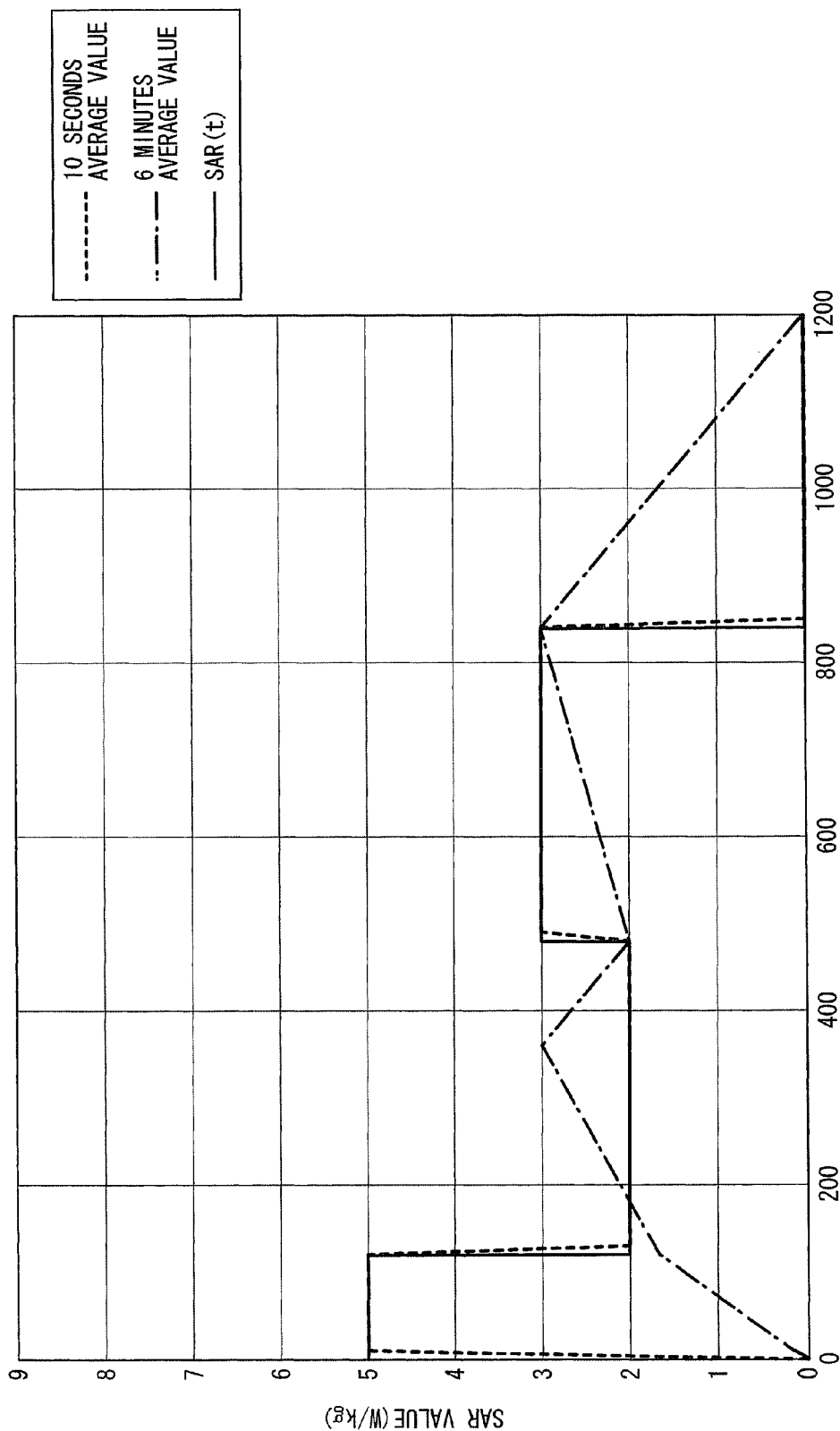
FIG. 15 is a graph showing time variations of the SAR intensity, the 10-second average SAR value, and the 6-minute average SAR value for the scan pattern (2)' in which the scan A' is first, the scan C is next, and the scan B' is final.

FIG. 15 is a graph similar to the graph of FIG. 5 showing time variations of the SAR intensity, the 10-second average SAR value, and the 6-minute average SAR value for the scan pattern (2)' in which the scan A' is first performed, then the scan C is performed, and finally the scan B' is performed.

As can be seen from the drawings, for both the patterns (1)' and (2)', the 10-second average SAR value and the 6-minute average SAR value have a margin with respect to their respective safety criterion values 12 [W/kg] and 4 [W/kg].

Figure 16:
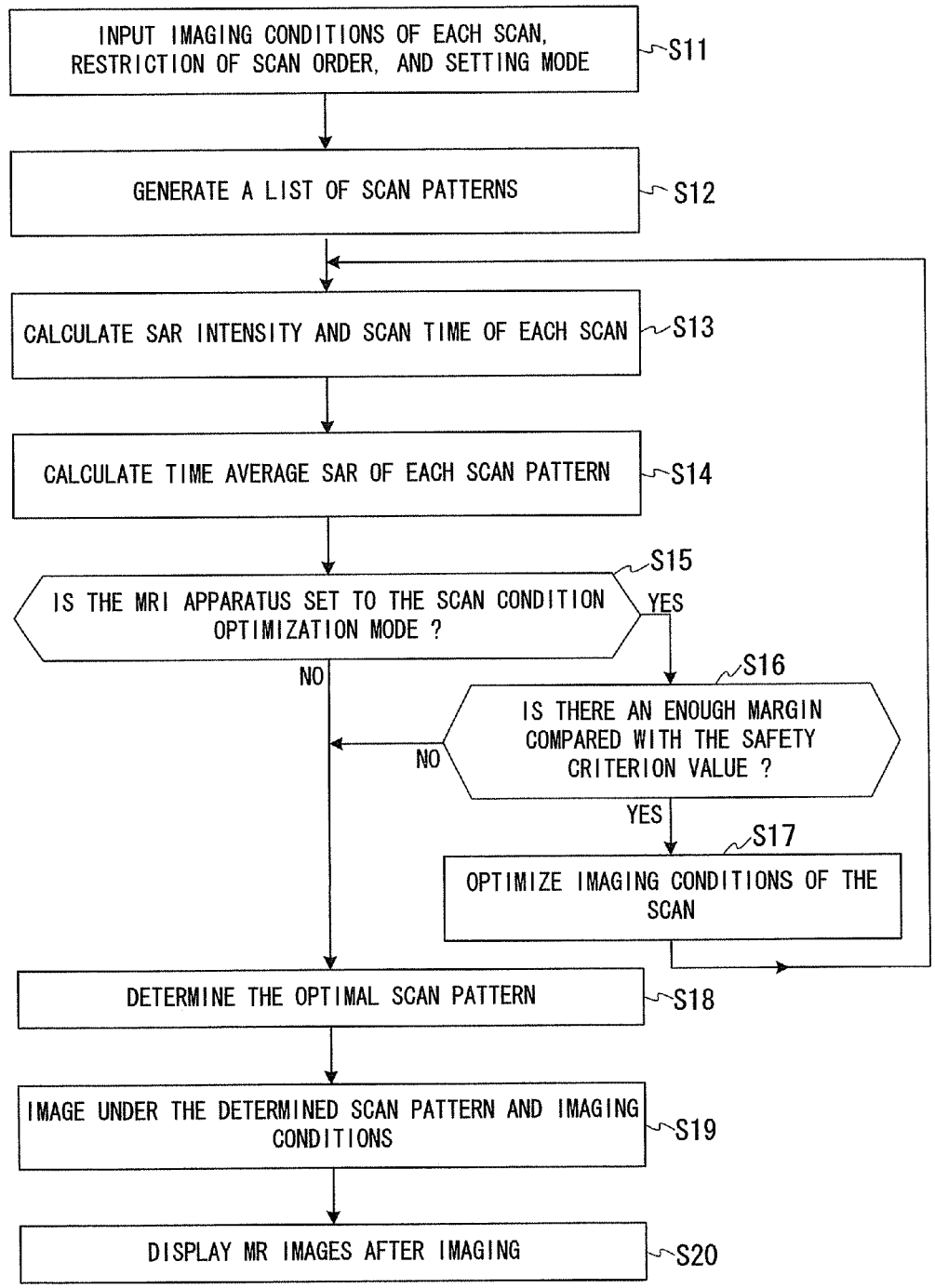
FIG. 16 is a flowchart for illustrating a flow of a process performed by the MRI apparatus 20 according to the second embodiment.

FIG. 16 is a flowchart for illustrating a flow of a process performed by the MRI apparatus 20 according to the second embodiment. In the following, according to the step numbers in the flowchart shown in FIG. 16, an operation of the MRI apparatus 20 according to the second embodiment will be described by referring to FIGS. 12 to 15 as required.

[Step S11] The operator inputs imaging conditions for the scans A', B' and C consecutively performed on the same object P via the input device 62. In addition, the operator selects any of "the fixed scan condition mode" and "the scan condition optimization mode" via the input device 62.

When the scan condition optimization mode is selected, "a scan whose imaging condition can be modified" is selected via the input device 62. In the following description, as an example, it is assumed that only the imaging conditions for the scans A' and B' can be modified, and the conditions are reflected in the processing in Step S17 described later.

In addition, in Step S11, the operator can set a condition for the scan order via the input device 62. For example, the condition referred to here is that the scan A' is performed after the scan B' or that the scan C is performed just before the scan A'. In the second embodiment, as an example, a condition that the scan A' is performed first is set.

The operator can also set, via the input device 62, the order in which MR images resulting from the scans are displayed after imaging. Then, the operation device 60 proceeds to Step S12.

[Step S12] The operation device 60 creates a list of scan order patterns based on the condition for the scan order set in Step S11. In the example in the second embodiment, there are two scan order patterns, that is, the pattern (1)' in which the scan A' is first performed, then the scan B' is performed, and finally the scan C is performed, and the pattern (2)' in which the scan A' is first performed, then the scan C is performed, and finally the scan B' is performed. Then, the operation device 60 proceeds to Step S13.

[Step S13] The operation device 60 calculates the SAR intensity [W/kg] and the scan duration for the scans A', B' and C based on the imaging conditions for the scans A', B' and C (see FIG. 12). Then, the operation device 60 proceeds to Step S14.

[Step S14] The operation device 60 calculates time variations of the 10-second average SAR value and the 6-minute average SAR value for each of the patterns (1)' and (2)' in the same procedure as in the first embodiment (see FIGS. 14 and 15). Then, the operation device 60 proceeds to Step S15.

[Step S15] When the fixed scan condition mode is selected in Step S11, the operation device 60 proceeds to Step S18. Otherwise (if the scan condition optimization mode is selected), the operation device 60 proceeds to Step S16.

[Step S16] Based on the result of calculation in Step S14, the operation device 60 judges whether or not there is a margin between the time average SAR and the safety criterion value for any of all the patterns (1)' and (2)'. In this example, supposing that the safety criterion value is 100%, it is judged that there is a margin if both the 10-second average SAR value and the 6-minute average SAR value are lower than 85% of the safety criterion value.

If the operation device 60 judges that there is a margin with respect to the safety criterion value, the operation device 60 proceeds to Step S17. If the operation device 60 judges that there is not a margin with respect to the safety criterion value, the operation device 60 proceeds to Step S18. A method of making this judgment will be described below.

First, the operation device 60 compares the maximum values of the 10-second average SAR value for all the patterns (1)' and (2)' with the safety criterion value (12 [W/kg], in this example). As shown in FIGS. 14 and 15, both for the patterns (1)' and (2)', the maximum value of the 10-second average SAR value is 5 [W/kg], which is lower than 85% of the safety criterion value.

In addition, the operation device 60 compares the maximum values of the 6-minute average SAR value for all the patterns (1)' and (2)' with the safety criterion value (4 [W/kg], in this example). As shown in FIGS. 14 and 15, the 6-minute average SAR value is 3.67 [W/kg] for the pattern (1)' and 3 [W/kg] for the pattern (2)'. Thus, although the 6-minute average SAR value for the pattern (1)' exceeds 85% of the safety criterion value, the 6-minute average SAR value for the pattern (2)' is lower than 85% of the safety criterion value. Thus, for the pattern (2)', both the maximum values of the 10-second average SAR value and the 6-minute average SAR value are lower than 85% of the respective safety criterion values. Therefore, the operation device 60 judges that there is a margin with respect to the safety criterion value and proceeds to Step S17.

[Step S17] The operation device 60 optimizes the imaging condition for each scan using, as a calculation reference, the pattern for which it is judged in Step S16 that both the maximum values of the 10-second average SAR value and the 6-minute average SAR value are lower than 85% of the safety criterion value. Then, the operation device 60 proceeds to Step S13.

The optimization referred to here means modifying the imaging condition for each scan so that the maximum value of the 10-second average SAR value and the maximum value of the 6-minute average SAR value come closer to the respective safety criterion values without exceeding the safety criterion values. In this example, the calculation reference for the optimization is the pattern (2)', and "the scans the imaging condition of which is to be modified" are the scans A' and B' for which modification of the imaging condition is permitted in Step S11.

As an example, the operation device 60 modifies the SAR intensity for the scans A' and B' to be equal to that for the scans A and B in the first embodiment. Then, the imaging condition for the pattern (2)' is the same as that for the pattern (2) in the first embodiment. That is, the 10-second average SAR value and the 6-minute average SAR value for the pattern (2)' are the same as those shown in FIG. 6. Thus, whereas the maximum value of the 10-second average SAR value is kept at a value lower than the safety criterion value, the maximum value of the 6-minute average SAR value is optimized to be equal to the safety criterion value. After this optimization processing, the operation device 60 proceeds to Steps S13, S14 and then S15 and makes the same judgment as described above in Step S16. This time, however, it is judged that there is not a margin with respect to the safety criterion value, and the process proceeds to Step S18. Modifications of the imaging condition to increase the SAR intensity that can be performed in the optimization processing described above include increasing the number of slices, increasing the flip angle, and a combination thereof, for example.

[Step S18] Based on the result of calculation in Step S14, the operation device 60 selects a pattern for which the maximum value of the 10-second average SAR value or the maximum value of the 6-minute average SAR value is the smallest, as an optimal scan order pattern.

If at least one of the maximum value of the 10-second average SAR value and the maximum value of the 6-minute average SAR value exceeds the safety criterion value for all the patterns, the operation device 60 displays an indication thereof on the display device 64 and returns the process to Step S11 to prompt the operator to set imaging conditions again.

The processing in Step S18 is the same as the processing in Step S5 in the first embodiment and therefore will not be described in detail. Then, the operation device 60 proceeds to Step S19.

[Step S19, S20] Imaging is performed in the same way as in Steps S6 and S7 in the first embodiment, and the resulting MR images are sequentially displayed.

The foregoing is a description of an operation of the MRI apparatus 20 according to the second embodiment. The second embodiment can provide the same advantages as the first embodiment.

In the second embodiment, the operator can set a condition for the scan order (step S11). Therefore, the second embodiment can cope with a case where the scan order has to be conditioned for a special examination. For example, in a case where an MR image of a blood vessel taken after injection of a contrast medium and an MR image of the same site taken under a predetermined condition without injection of a contrast medium are to be compared with each other, the imaging (scan) of the latter MR image has to be performed before the imaging of the former MR image. The second embodiment can cope with such a case.

Furthermore, if there is a margin between the time average SAR and the safety criterion value, the imaging condition for the scan for which modification of the imaging condition is permitted in Step S11 is modified to bring the time average SAR closer to the safety criterion value (Step S17). Therefore, imaging can be performed under the optimized conditions by, for example, maximizing the number of slices, as far as the SAR value does not exceed the safety criterion value.

<Supplementary Notes on Embodiment>

[1] In the first and second embodiments, there has been described an example in which the order of display of MR images resulting from different scans after imaging can be set (Step S1 in FIG. 1 and Step S11 in FIG. 16). However, embodiments of the present invention are not limited to such an aspect. For example, in a case where the MRI apparatus 20 transfers the MR images to another apparatus via a network, the MR images can be displayed on the destination apparatus in the order specified by the operator in Step S1, S11.

[2] In the first and second embodiments, there has been described an example in which the scans A, B and C or the scans A', B' and C are consecutively performed without intermission. However, embodiments of the present invention are not limited to such an aspect. The present invention can be applied to a case where a rest period is allowed between the scans A, B and C. In such a case, the time average SAR can be calculated by considering the rest period in the same manner as in Step S4 in the first embodiment, and the scan order for which the time average SAR is the smallest can be selected.

[3] In the first embodiment, there has been described an example in which, in Step S5, if there are a plurality of scan patterns for which both the maximum value of the 10-second average SAR value and the maximum value of the 6-minute average SAR value are equal to or lower than the respective safety criterion values, the pattern for which the maximum value of the 6-minute average SAR value is the smallest is automatically selected. However, embodiments of the present invention are not limited to such an aspect.

In the case where there are plurality of patterns for which both the maximum value of the 10-second average SAR value and the maximum value of the 6-minute average SAR value are equal to or lower than the respective safety criterion values, the operation device 60 can also automatically select a pattern that is closest to the scan order provisionally set by the operator, the initially set scan order, or the currently set scan order.

Alternatively, a graph showing time variations of the 10-second average SAR value and the 6-minute average SAR value for all the scan patterns can be displayed on the display device 64 in Step S5 in the first embodiment, and the operator can select the scan order pattern through manipulation of the input device 62 with reference to the graph shown on the display device 64.

[4] In Step S18 in the second embodiment, if there are a plurality of patterns for which both the maximum value of the 10-second average SAR value and the maximum value of the 6-minute average SAR value are equal to or lower than the respective safety criterion values, the scan orders for the plurality of patterns or a graph showing time variations of the SAR values can be displayed, and the operator can select the pattern used for imaging. This is because the operator may want to select the scan order closest to the initially inputted scan order, once the condition that the maximum values of the SAR values are equal to or lower than the safety criterion values is satisfied.

[5] In the second embodiment, there has been described an example in which the MRI apparatus 20 automatically optimize the imaging conditions (Step S17). However, embodiments of the present invention are not limited to such an aspect. Some correction options for the imaging condition for each scan can be displayed, and the operator can select from among the correction options. For example, for a pattern for which the time average SAR has a margin with respect to the safety criterion value, the allowable number of additional slices can be displayed.

Alternatively, a graph showing time variations of the 10-second average SAR value and the 6-minute average SAR value for all the scan patterns can be displayed on the display device 64 before the scan order is determined, and the operator can edit the imaging condition through manipulation of the input device 62 with reference to the graph shown on the display device 64. In the display, for example, values that exceed the safety criterion value are preferably color-coded with red so that the values can be easily distinguished. In this case, once the operator modifies the imaging condition, time variations of the 10-second average SAR value and the 6-minute average SAR value can be calculated again, and a graph showing the time variations can be displayed so that the imaging condition can be edited again in the same way.

[6] In the first and second embodiments, there has been described an example in which both the 10-second average SAR value and the 6-minute average SAR value are calculated, and the optimal scan order is selected based on the result of the calculation. However, embodiments of the present invention are not limited to such an aspect.

If the SAR intensity is lower than the safety criterion value (12 [W/kg]) of the 10-second average SAR value for all the scans A, B and C (or A', B' and C) as shown in FIGS. 2 and 12, it is obvious that the 10-second average SAR value meets the safety criterion (unless the imaging condition is modified). Therefore, in such a case (in the case in the first and second embodiments), the operation device 60 does not calculate the 10-second average SAR value and can select the optimal scan order based on the calculation result of the 6-minute average SAR value. In this case, calculations can be simplified.

[7] In the first and second embodiments, there has been described an example in which the 10-second average SAR value and the 6-minute average SAR value are calculated in accordance with the International Electrotechnical Commission (IEC) standard at the time of the present application. However, embodiments of the present invention are not limited to such an aspect. A SAR value for a different length of time, such as a 3 minute average SAR value, can also be calculated to consider a possible modification of the conventional standard.

[8] On the same principle as in the first embodiment, the operation device 60 can automatically select the scan order for which the temperature rise of a gradient coil 26 is the smallest rather than the scan order for which the time average SAR is the smallest. This is because the temperature of the gradient coil 26 also has an upper limit for a reason of a physical factor relating to the material of the gradient coil 26 or a reason of precision of the control to achieve target values of gradient magnetic fields Gx, Gy and Gz in three axis directions formed in the region to be imaged.

More specifically, for example, the intensity, the application duration or the like of a gradient magnetic field pulse is calculated for each of the scans A, B and C in Step S2 in the first embodiment shown in FIG. 11, and a list of scan patterns is created in Step S3. Then, a time variation of the temperature of the gradient coil 26 for each scan pattern can be estimated based on the circuit configuration of the MRI apparatus 20, characteristics of the gradient coil 26 or the like in Step S4, and "the scan order for which the maximum value of the estimate value of the possible temperature of the gradient coil 26 is the smallest" can be selected in Step S5. The remainder of the process is the same as the processing in Steps S1, S6 and S7 in the first embodiment, and therefore, redundant descriptions thereof will be omitted.

According to the embodiments described in detail above, in a case where a plurality of scans are consecutively performed in MRI, a scan order for which a parameter having an upper limit, such as SAR, has a small value can be selected.

[9] Correspondences between terms used in the claims and terms used in the embodiment described above will be described. Note that the correspondences described below are just some of possible interpretations for reference and should not be construed as limiting the present invention.

The functions of a static magnetic field magnet 22, a shim coil 24, the gradient coil 26, an RF coil 28 and a control system 30 (see FIG. 1) that generates an RF pulse, transmits the RF pulse to the object P, receives an MR signal from the object P and generates image data on an MR image of the object P resulting from each scan based on the received MR signal are an example of an imaging unit described in the claims.

"The function of the operation device 60 that creates a list of scan order patterns for a plurality of scans, calculates SAR for each pattern and select a pattern for which the time average SAR is the smallest" and "the function of the operation device 60 that optimizes the imaging condition in a case where the time average SAR has a margin with respect to the safety criterion value" are an example of a calculation unit described in the claims.

The safety criterion value is an example of an upper limit value described in the claims.

The value "85% of the safety criterion value" that is used in the second embodiment as a reference for the judgment of whether or not there is a margin with respect to the safety criterion value is an example of a predetermined value described in the claims.

The display device 64 is an example of a display unit described in the claims.

The input device 62 is an example of an input unit, a display order setting unit and a selection unit described in the claims.

[10] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus that performs a scan operation that includes transmitting an RF pulse to cause a nuclear magnetic resonance to an object and receiving a nuclear magnetic resonance signal caused by said RF pulse from said object, comprising:
   a calculation unit that calculates a value of SAR for each of a plurality of patterns of a predetermined number of scan orders for a plurality of scan operations for said object, one of the patterns being selected based upon the calculated values of SAR; and
   an imaging unit that generates image data for each of said scan operations by continuously performing said plurality of scan operations based on the selected one of the patterns.

2. The magnetic resonance imaging apparatus according to claim 1,
   wherein said calculation unit is configured to automatically select a pattern for which a maximum value of the SAR is the smallest from among said plurality of patterns for which the SAR is to be calculated, and said imaging unit is configured to consecutively perform said plurality of scan operations in accordance with said pattern selected by said calculation unit.

3. The magnetic resonance imaging apparatus according to claim 1,
wherein said calculation unit is configured to automatically select a pattern that is closest to an initially set scan order for said plurality of scan operations in a case where there are plurality of patterns for which calculated SAR does not exceed an upper limit value, and
said imaging unit is configured to consecutively perform said plurality of scan operations in accordance with said pattern selected by said calculation unit.

4. The magnetic resonance imaging apparatus according to claim 1,
wherein, in a case where there is a pattern for which calculated SAR does not exceed a predetermined value, said calculation unit is configured to correct at least one imaging condition for said plurality of scan operations so as to bring the SAR closer to said predetermined value while preventing the SAR from exceeding said predetermined value.

5. The magnetic resonance imaging apparatus according to claim 4,
wherein said calculation unit is configured to calculate the SAR again for each of said plurality of patterns after correcting said imaging condition and automatically select a pattern for which a maximum value of the SAR calculated again is the smallest, and
said imaging unit is configured to consecutively perform said plurality of scan operations in accordance with said pattern selected by said calculation unit.

6. The magnetic resonance imaging apparatus according to claim 5,
wherein said calculation unit is configured to correct at least one of number of slices and a flip angle as said imaging condition.

7. The magnetic resonance imaging apparatus according to claim 1, further comprising:
a display order setting unit that sets an order of display of images resulting from said plurality of scan operations based on inputted information; and
a display unit that displays said images represented by said image date for said scan operations in said order of display set by said display order setting unit after said plurality of scan operations are performed.

8. The magnetic resonance imaging apparatus according to claim 1, further comprising:
a display unit that displays the SAR calculated by said calculation unit for each of said plurality of patterns before said plurality of scan operations are performed; and
a selection unit that selects any of said plurality of patterns for which the SAR is to be displayed based on inputted information,
wherein said imaging unit is configured to consecutively perform said plurality of scan operations in accordance with said pattern selected by said selection unit.

9. The magnetic resonance imaging apparatus according to claim 1,
wherein said calculation unit is configured to perform calculation of a 10-second average SAR value and a 6-minute average SAR value and automatically select any of said plurality of patterns for which the SAR is to be calculated based on a result of the calculation.

10. The magnetic resonance imaging apparatus according to claim 1,
wherein said calculation unit is configured to perform calculation of a 6-minute average SAR value and automatically select any of said plurality of patterns for which the SAR is to be calculated based on a result of the calculation.

11. The magnetic resonance imaging apparatus according to claim 1, further comprising:
an input unit that sets a condition to restrict the order of said plurality of scan operations based on inputted information before said plurality of scan operations are performed,
wherein said calculation unit is configured to calculate the SAR for each pattern of said plurality of patterns that satisfies said condition.

12. The magnetic resonance imaging apparatus according to claim 11,
wherein said calculation unit is configured to automatically select a pattern for which a maximum value of the SAR is the smallest from among said plurality of patterns for which the SAR is to be calculated, and
said imaging unit is configured to consecutively perform said plurality of scan operations in accordance with said pattern selected by said calculation unit.

13. The magnetic resonance imaging apparatus according to claim 11,
wherein said calculation unit is configured to automatically select a pattern that is closest to an initially set scan order for said plurality of scan operations in a case where there are plurality of patterns for which calculated SAR does not exceed an upper limit value, and
said imaging unit is configured to consecutively perform said plurality of scan operations in accordance with said pattern selected by said calculation unit.

14. The magnetic resonance imaging apparatus according to claim 11,
wherein, in a case where there is a pattern for which calculated SAR does not exceed a predetermined value, said calculation unit is configured to correct at least one imaging condition for said plurality of scan operations so as to bring the SAR closer to said predetermined value while preventing the SAR from exceeding said predetermined value.

15. The magnetic resonance imaging apparatus according to claim 14,
wherein said calculation unit is configured to calculate the SAR again for each of said plurality of patterns after correcting said imaging condition and automatically select a pattern for which a maximum value of the SAR calculated again is the smallest, and
said imaging unit is configured to consecutively perform said plurality of scan operations in accordance with said pattern selected by said calculation unit.

16. A magnetic resonance imaging method that includes a scan operation in which an RF pulse for causing a nuclear magnetic resonance is transmitted to an object and a nuclear magnetic resonance signal caused by said RF pulse is received from said object, comprising the steps of:
calculating a value of SAR for each of a plurality of patterns of a predetermined number of scan orders for a plurality of can operations for said object, one of the patterns being selected based upon the calculated values of SAR; and generating image data for each of said scan operations by continuously performing said plurality of scan operations based on the selected one of the patterns.

* * * * *